US008674261B2

(12) United States Patent
No et al.

(10) Patent No.: US 8,674,261 B2
(45) Date of Patent: Mar. 18, 2014

(54) METHOD FOR MANUFACTURING A SOLAR CELL MODULE BY LASER BONDING

(75) Inventors: Dong Hun No, Chungchengbuk-do (KR); Dong Sik Jang, Daejeon (KR); Je Min Yu, Daejeon (KR)

(73) Assignee: LG Hausys, Ltd., Seoul (KR)

( * ) Notice: Subject to any disclaimer, the term of this patent is extended or adjusted under 35 U.S.C. 154(b) by 744 days.

(21) Appl. No.: 12/745,225

(22) PCT Filed: Nov. 18, 2008

(86) PCT No.: PCT/KR2008/006792
§ 371 (c)(1),
(2), (4) Date: Nov. 1, 2010

(87) PCT Pub. No.: WO2009/072760
PCT Pub. Date: Jun. 11, 2009

(65) Prior Publication Data
US 2011/0031225 A1    Feb. 10, 2011

(30) Foreign Application Priority Data
Dec. 3, 2007   (KR) .................... 10-2007-0124320

(51) Int. Cl.
*B23K 26/20*   (2006.01)
*B23K 1/005*   (2006.01)
(52) U.S. Cl.
USPC ............ 219/121.85; 219/121.13; 219/121.64; 219/161
(58) Field of Classification Search
USPC ............... 219/121.6, 121.63, 121.64, 121.85, 219/161; 228/44.3, 44.7
See application file for complete search history.

(56) References Cited

U.S. PATENT DOCUMENTS

| 4,562,637 A | 1/1986 | Kushima et al. |
| 4,959,522 A * | 9/1990 | Rossi ........................ 219/121.63 |
| 5,823,417 A * | 10/1998 | Johnson ................... 219/121.63 |
| 6,333,483 B1 * | 12/2001 | Ueno ........................ 219/121.64 |
| 6,414,235 B1 | 7/2002 | Luch |
| 6,839,171 B2 * | 1/2005 | Mizutani et al. ......... 359/487.06 |

(Continued)

FOREIGN PATENT DOCUMENTS

| DE | 102004009950 A1 * | 9/2005 |
| EP | 1205982 | 5/2002 |

(Continued)

OTHER PUBLICATIONS

Machine translation of Japan Patent document No. 2004-134,654, Mar. 2013.*

*Primary Examiner* — Geoffrey S Evans
(74) *Attorney, Agent, or Firm* — McKenna Long & Aldridge, LLP

(57) ABSTRACT

The present invention relates to a method and apparatus for manufacturing a solar cell module using a laser. In the present invention, a tabbing process for bonding a solar cell and metal electrodes is performed by a local irradiation with a laser, so that the heating area can be localized only to a required zone (bonding area) for the tabbing process, thereby minimizing a direct heating zone which occurs in the process. Therefore, it is possible to reduce the damage such as cracks and breakage due to thermal expansion/contraction of a solar cell which is conventionally configured to have a multi-layered structure made of different materials, to improve the bonding strength and the bonding uniformity, and to reduce the processing time, thereby improving the production efficiency.

12 Claims, 15 Drawing Sheets

(56) References Cited

U.S. PATENT DOCUMENTS

| | | |
|---|---|---|
| 2002/0038792 A1* | 4/2002 | Terada et al. ............... 219/121.6 |
| 2002/0153039 A1* | 10/2002 | Moon et al. .................. 136/256 |
| 2003/0230555 A1* | 12/2003 | Kummle ................. 219/121.63 |
| 2004/0084424 A1* | 5/2004 | Kruckels ................. 219/121.63 |
| 2004/0261840 A1* | 12/2004 | Schmit et al. ................. 136/258 |
| 2005/0092719 A1* | 5/2005 | Wright et al. ............ 219/121.63 |
| 2005/0167407 A1* | 8/2005 | Chen et al. ............... 219/121.64 |
| 2006/0237401 A1* | 10/2006 | Amesbury et al. ....... 219/121.63 |
| 2006/0266473 A1* | 11/2006 | Senapati et al. ............. 156/290 |
| 2007/0221637 A1* | 9/2007 | Schurmann et al. ..... 219/121.63 |
| 2010/0180558 A1* | 7/2010 | Ito et al. ......................... 55/361 |

FOREIGN PATENT DOCUMENTS

| | | | |
|---|---|---|---|
| JP | 60-202968 | | 10/1985 |
| JP | 63-115671 A | * | 5/1988 |
| JP | 04-091493 | | 3/1992 |
| JP | 09-327781 A | * | 12/1997 |
| JP | 2004-134654 | | 4/2004 |
| JP | 2004-134654 A | | 4/2004 |
| WO | WO 2006/000834 A1 | | 1/2006 |

\* cited by examiner

METHOD FOR MANUFACTURING A SOLAR CELL MODULE BY LASER BONDING

This application is a National Stage Entry of International Application No. PCT/KR2008/006792, filed Nov. 18, 2008, and claims the benefit of Korean Application No. 10-2007-0124320, filed on Dec. 3, 2007, which is hereby incorporated by reference for all purposes as if fully set forth herein.

TECHNICAL FIELD

The present invention relates to a method for manufacturing a solar cell module and an apparatus therefor.

BACKGROUND ART

Recently, due to problems of environmental pollution and fossil energy depletion in the earth, the development of eco-friendly alternative energy sources and the diversification of future energy sources have appeared as international issues. Under the circumstances, a solar cell has been spotlighted as a future influential alternative energy source, and a continuous drop in the price of the solar cell has caused a world market size related to the solar cell to be rapidly increased.

A solar cell module, which is an essential element in a solar photovoltaic power generation system, has advantages in that a lifetime of about 20 years or more so that it may be semi-permanently used, and a large-sized solar cell module as well as a small-sized solar cell module can be freely manufactured depending on installation locations and scales. In a solar cell module, a thermal bonding process by which solar cells are modularized by being connected to one another in series via power lines, i.e., metal electrodes (ribbons), is referred to as a tabbing or soldering process. A conventional tabbing process is performed in such a manner that a bonding portion between a metal electrode (or ribbon) and a solar cell is heated using a halogen infrared lamp (IR tabbing process) or manually welded by a worker. However, the aforementioned methods, particularly, the IR tabbing process has a problem in that a zone directly irradiated by the infrared lamp is excessively larger than a bonding area required for the tabbing process so that a solar cell module may be more likely to be damaged during the tabbing process. Typically, a solar cell such as a crystal silicon solar cell has a multi-layered structure (e.g., including Al coating layer, Si wafer layer and $SiN_3Ar$ coating layer) of which the layers are made of different materials. Accordingly, if a directly-irradiated zone is excessively large as described above in the same manner as the conventional IR tabbing process, differences in thermal expansion/contraction behaviors of the materials for the respective layers of the solar cell upon application of thermal energy thereto cause the solar cell module to be bent up to 3 mm, resulting in defects in the solar cell module, such as a crack, breakage, damage or warping.

These problems hinder the recently required thinness of solar cells. That is, most of the crystal silicon solar cells, which have been conventionally used, generally have a thickness of about 230 μm, but solar cells even having a thickness of about 50 μm have the substantially same efficiency. Accordingly, since the silicon depletion and the increasing manufacturing cost caused by the increasing demand for silicon have been recently raised, recently, the requirements for thinness of solar cells are increased. As such, the problems of the conventional tabbing process would be more raised, and therefore, a new tabbing method has been required in which a direct radiation zone in a solar cell is minimized during the tabbing process, thereby preventing the solar cell from being damaged due to different physical properties (thermal expansion/contraction coefficient, and the like) of materials of a multi-layered structure, the bonding property and boding uniformity between the solar cell and electrodes can be improved, and the manufacturing efficiency can be increased.

DISCLOSURE

Technical Problem

The present invention is conceived to solve the aforementioned problems in the prior art. An object of the present invention is to provide a method and apparatus for manufacturing a solar cell module, in which a bonding process between a metal electrode and the solar cell is performed by local heating with a laser, so that a fraction defective in the tabbing process can be reduced, the bonding strength and bonding uniformity can be improved, and the processing time can be reduced, thereby improving the productivity.

Technical Solution

According to an aspect of the present invention for achieving the objects, there is provided a method for manufacturing a solar cell module, which comprises: a first step of compressing a metal electrode onto a solar cell; and a second step of performing a tabbing process by irradiating a contact portion of the metal electrode and the solar cell with a laser.

According to another aspect of the present invention for achieving the objects, there is provided an apparatus for manufacturing a solar cell module, which comprises: a worktable on which a solar cell is loaded; a compressing device that is capable of compressing a metal electrode on the solar cell loaded on the worktable; and a laser irradiation device capable of irradiating a contact portion of the metal electrode and the solar cell with a laser.

Advantageous Effects

According to the present invention, a tabbing process of a solar cell and a metal electrode is performed by local heating with a laser, which can localize a heating zone to a minimally required area, so that a direct radiation zone to which thermal energy is directly radiated can be minimized during the process. Therefore, according to the present invention, there are advantages in that it is possible to reduce a fraction defective (generation of crack, breakage and damage) caused by different physical properties (thermal expansion/contraction coefficient) between materials of the solar cell configured to have a multi-layered structure, to provide the high and uniform bonding strength to the contact portion, and to reduce the processing time, thereby improving the production efficiency.

MODE FOR INVENTION

Figure 1:
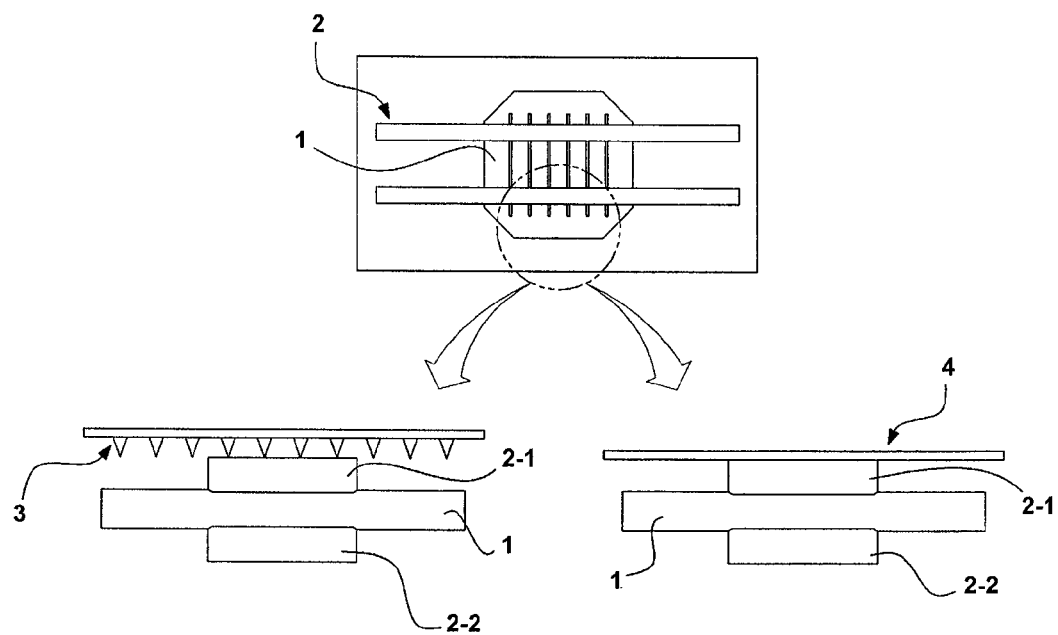
FIG. 1 is a schematic view illustrating a process through which metal electrodes are compressed onto a solar cell in accordance with one embodiment of the present invention.

The present invention is related to a method for manufacturing a solar cell module, which comprises: a first step of compressing a metal electrode onto a solar cell; and a second step of performing a tabbing process by irradiating a contact portion of the metal electrode and the solar cell with a laser.

Hereinafter, the method according to the present invention will be described in detail.

The first step of the present invention is a step of preparing a tabbing process by compressing a metal electrode onto a solar cell. At this time, the kind of solar cell onto which the metal electrode is compressed is not specifically limited, but a crystal silicon solar cell, such as a single crystal silicon solar cell and a polycrystalline silicone solar cell, may be included in an example of the solar cell.

The method of the present invention may be effectively applied to a thinned solar cell, since a direct radiation zone and a mechanical stress (or thermal stress) applied to the thin solar cell can be minimized. Therefore, the solar cell applied to the present method may have a thickness ranging from 80 μm to 200 μm. If the thickness is less than 80 μm, it is apprehended that the efficiency of the solar cell is decreased. If the thickness is more than 200 μm, it is apprehended that economical efficiency is lowered.

The kind of the metal electrode (ribbon) to be compressed in the first step of the present invention is not specifically limited, but all metal electrodes which have been conventionally used in a solar cell field may be included in an example of the metal electrode. A Cu electrode may be a representative example of the metal electrode as described above. Generally, there is a low melting point alloy layer (e.g., an alloy layer of Cu, Sn and Al), whose melting point is about 260° C., on upper and lower portions of the Cu electrode as described above. Conventionally, the metal electrode as described above has a width ranging from 1.5 mm to 2.5 mm and a thickness ranging from 80 μm to 300 μm. However, the present invention is not limited thereto, but various metal electrodes may be used. If the metal electrodes are excessively thin, there is an advantage in that the power or scanning speed of a laser used in tabbing can be reduced, but the efficiency of a solar cell module may be decreased due to the increase of the electrode resistance. Therefore, it is preferable to select the electrode having an appropriate thickness according to applications.

The metal electrode is compressed onto the solar cell in the first step of the present invention, at this time it is preferable that uniform pressure is applied with respect to the whole contact portions of the metal electrode and the solar cells. If uniform compression is not carried out, it is apprehended that the metal electrode is not uniformly bonded to the solar cell, and thereby efficiency of the solar cell module is lowered due to electrical loss. In the present invention, for instance, the compression process may be carried out by using a compression device comprising probe pin, pressurizing plate, compressing roll or air-nozzle. However, the above description is no more than an example of the present invention, and the means for compression is not specifically limited only if the metal electrodes can be uniformly and closely compressed onto the solar cell.

Further, it is preferable that the metal electrodes be simultaneously compressed on front and rear surfaces of the solar cell in the first step of the present invention. That is, as shown in FIG. 1, the metal electrodes 2 are tabbed on the left and right sides of the front surface of the solar cell 1, respectively. At this time, the metal electrodes are bonded onto the left and right sides of the rear surface of the solar cell as well as the left and right sides of the front surface of the solar cell. Accordingly, all the four metal electrodes are simultaneously compressed onto the left and right sides of the front and rear surfaces of the single solar cell in accordance with the present invention, respectively, and then, left and right sides thereof are irradiated with a laser, thereby performing the tabbing process. If such a process is performed, the heat to be generated by the laser applied to the upper portion is conducted to the lower portion, so that the tabbing process can be performed in the upper and lower portions simultaneously. It is preferable in the first step of the present invention that the compression of the metal electrodes is performed at a pressure of 0.3 N/m to 0.6 N/m. The contact of the metal electrodes may be deteriorated if the pressure is smaller than 0.3 N/m, whereas the excessive pressure may damage the solar cell if the pressure is larger than 0.6 N/m.

Figure 2:
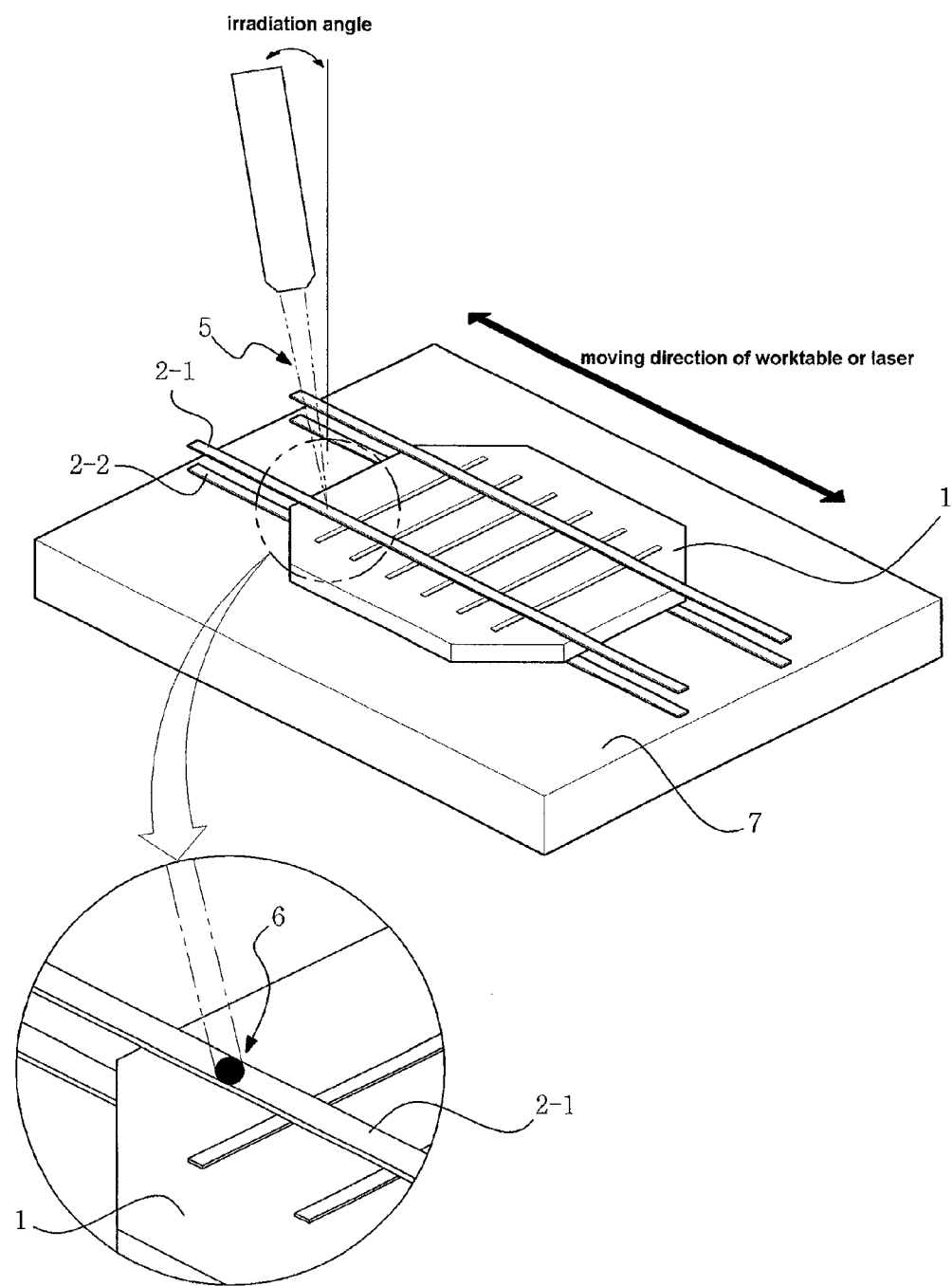
FIG. 2 is a schematic view illustrating a state where a tabbing process is performed using irradiation with a laser in accordance with the embodiment of the present invention.

In the second step of the present invention, the tabbing process is performed by irradiating the contact portions of the solar cell and the metal electrode with a laser. A process of performing the second step of the present invention will be specifically described with reference to the accompanying drawings. FIG. 2 of the accompanying drawings is a schematic view showing a state where the tabbing process is performed by irradiation with a laser according to one embodiment of the present invention. As shown in FIG. 2, in the second step, the tabbing process is performed by locally heating the contact portions of the solar cell 1 and the metal electrodes 2-1 and 2-2 by a laser 5. It is preferable that the laser 5 radiated in the second step be a defocused laser. If the focused laser is used to perform the tabbing process of the present invention, the energy applied to the contact portion is excessively high, so that the degradation such as deformation of the solar cell may be generated.

It is, preferable that in the second step of the present invention, a defocused core size 6, in which the defocused laser as described above is diffused in the contact portion, is controlled to be identical with the width of the metal electrodes 2-1 and 2-2. Such control can cause a direct heating zone with a laser to be localized to a minimal area required to perform the tabbing process. If the defocused core size is smaller than the width of the metal electrode, it may be difficult to uniformly heat the contact portion. If the defocused core size is larger than the width of the metal electrode, the front surface of the solar cell other than the contact portion is directly irradiated with the laser, so that the solar cell may be damaged. Since the width of the metal electrode ranges from about 1.5 to 2.5 mm as described above, the defocused core size may be controlled to range from 1.5 to 2.5 mm in the present invention. However, the above description is no more than one example, and the specific values may not be specifically limited thereto in the present invention only if the defocused core size is controlled to be identical with the width of the metal electrode.

Further, the laser used in the second step of the present invention has preferably a wavelength of 700 nm to 1000 nm, and more preferably 800 nm to 900 nm. Further, the maximum power of the laser preferably ranges from 20 W to 150 W, and more preferably from 90 W to 110 W. If the wavelength of the irradiation laser is smaller than 700 nm, there is a problem in relation to the bonding strength and the like under a fast tabbing speed, so that the fraction defective may increase. Further, if the wavelength is larger than 1000 nm, the tabbing process may not be performed smoothly. However, the wavelength and maximum power of the laser as described above is no more than an example of the present invention, and therefore, they may be appropriately adjusted depending on the specification of the solar cell and/or the thickness of the metal electrode, which are applied in the tabbing process. For example, if the method of the present invention is performed using a 5 inch solar cell and metal electrodes having a thickness of 150 μm, it is preferable that the wavelength of the laser is about 808 nm and the maximum power is about 60 W.

In the present invention, it is preferable that the laser be radiated from the upper side perpendicular to the widthwise direction of the electrode in the contact portion of the electrode and the solar cell. The term ⌈widthwise direction⌋ refers to a direction perpendicular to a lengthwise direction of the electrode constituting the contact portion. That is, in the present invention, it is preferable that the laser is radiated in the same vertical plane with the contact portion line, and such control of the radiation direction can be accomplished by using a compressing device comprising a laser-permeable ceramic, compressing roll or air-nozzle as described later. In the present invention, the term ⌈same vertical plane with the contact portion line⌋ refers to a imaginary plane which is formed upward perpendicular to the surface of the solar cell according to the contact portion line (the lengthwise direction of the electrode). Since the laser is radiated in the same vertical plane with the contact portion line, there is advantage in that the irradiation angle of the laser may be freely controlled, and focusing of the laser may be easily accomplished since the laser beam is refracted in the same line with the contact portion.

In the present invention, the irradiation angle of the laser in the second step of the present invention may be controlled to range from 0 to 90 degrees, preferably not more than 40 degrees, more preferably not more than 20 degrees, and most preferably 10 degrees. The ⌈irradiation angle⌋ used herein refers to an angle between an irradiated laser and a normal line that is formed with respect to the contact portion line on which the laser is radiated. In the present invention, according to a solar cell and/or a metal electrode, the irradiation angle is controlled within the above range so that an average reflexibility may be minimized. In the present invention, as described above, since the irradiation angle and the refractive direction of the laser are optimized, and thereby the tabbing process may be carried out with minimized energy loss. Therefore, in the present invention, electrode arranging speed per unit time can be increased. However, the above description is no more than an example of the present invention, and therefore, the irradiation angle may be adjusted, considering the size of the solar cell, the intervals of the tabbed metal electrodes, the possibility of damaging apparatus (ex. focusing head of the laser device) due to the refracted laser, and the like As shown in FIG. 2, according to the present invention, the second step may be performed while the solar cell or the laser is moved in a tabbing direction. The term ⌈tabbing direction⌋ used in the present invention refers to a lengthwise direction of the metal electrode positioned on the solar cell, wherein the movement may cause the laser to sequentially scan the contact portions and heat them. At this time, the movement may be performed by moving a worktable on which the solar cell is mounted, or the irradiation laser itself. Here, the moving speed may be adjusted considering the tabbing efficiency relative to laser irradiation time depending on the power of laser, the defocused core size, the kind of the solar cell and/or the metal electrodes, and the like, and is not specifically limited. For example, if the metal electrode having a width of about 2 mm and a thickness of about 150 μm, and the defocused laser having a power of 60 W are used to perform the tabbing process, the scanning speed may be not less than about 10 mm/sec, preferably about 25 mm/sec to 125 mm/sec, more preferably about 62.5 mm/sec to 125 mm/sec. However, the above description is no more than an example of the present invention, and without performing the moving process required in case of using a spot beam, one or more laser irradiation devices (line beam) may be used to simultaneously heat the total length of the metal electrodes to be tabbed in the present invention. Thus, only the single irradiation makes it possible to perform the tabbing process.

The term ⌈spot beam⌋ used in the present invention refers to a case where a device is configured to irradiate a predetermined dot region of the metal electrode on the solar cell with a laser, while the term ⌈line beam⌋ refers to a case where a device is configured to irradiate the total region of the metal electrode on the contact portion with a laser simultaneously. In a case where such a line beam heats the total length of the metal electrode simultaneously at a time to perform the tabbing process, the process time per the single solar cell can be reduced to be about 1 to 2 seconds.

Figure 3:
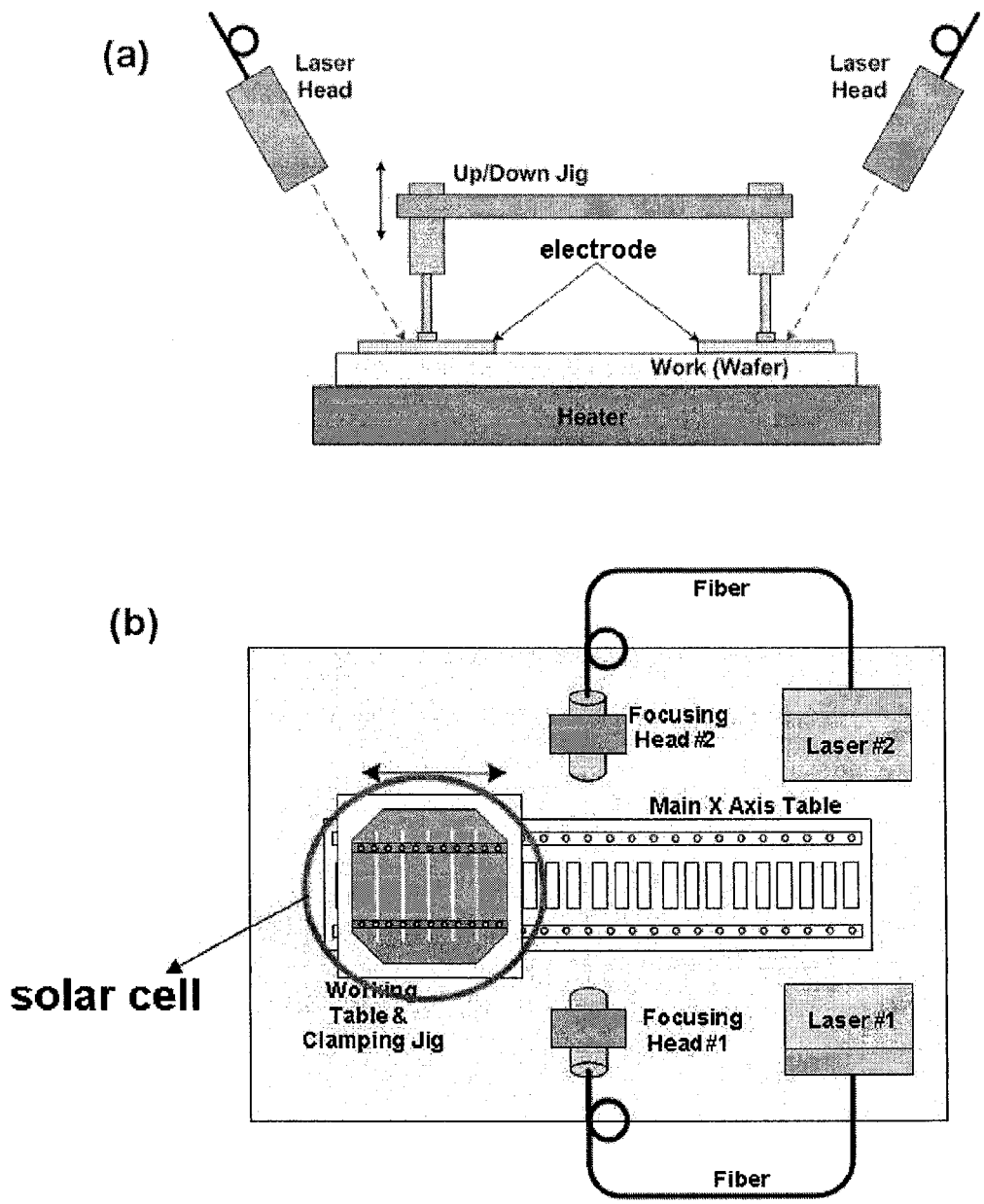
FIG. 3 is a schematic view illustrating a state where a tabbing process is performed using irradiation with a laser in accordance with another embodiment of the present invention.

It is preferred in the present invention that the second step is performed while the lower portion of the solar cell is heated at a predetermined temperature. At this time, the heating temperature preferably ranges from 110° C. to 180° C. That is, since the crystalline silicon solar cell or the like has high thermal conductivity, the heat absorbed in the electrode contact portion may not be used in the tabbing process but may quickly vanish. Therefore, the tabbing process is performed while the lower portion of the solar cell is heated with an appropriate heating means, so that the efficiency of the tabbing process can be further improved. Further, when the metal electrodes are simultaneously compressed onto the front and the rear surfaces of the solar cell to perform the tabbing process as described above, the thermal conduction due to the heat input by the laser alone may not satisfy the energy required for the tabbing process. Therefore, there is an advantage in that the heating process for the lower portion can compensate such insufficient energy. The kind of the heating means and the heating method, which may be used in the present invention, are not specifically limited. For example, there is a method wherein a heating plate is mounted on a worktable onto which the solar cell is loaded, the solar cell is mounted on the heating plate, and then the solar cell is heated by the heating plate while the tabbing process is performed. Further, as shown in FIG. 3, it is preferred in the present invention that two laser irradiation devices be provided and the laser be simultaneously radiated in the left and right directions of the solar cell on which the metal electrodes are compressed. Accordingly, the metal electrodes positioned on the left and right sides of the solar cell are simultaneously tabbed by the single process, so that the efficiency of the process can be further improved. FIG. 3 (*a*) is a side view illustrating a tabbing process performed according to an aspect of the present invention, while FIG. 3 (*b*) is a plan view illustrating the tabbing process.

Figure 4:
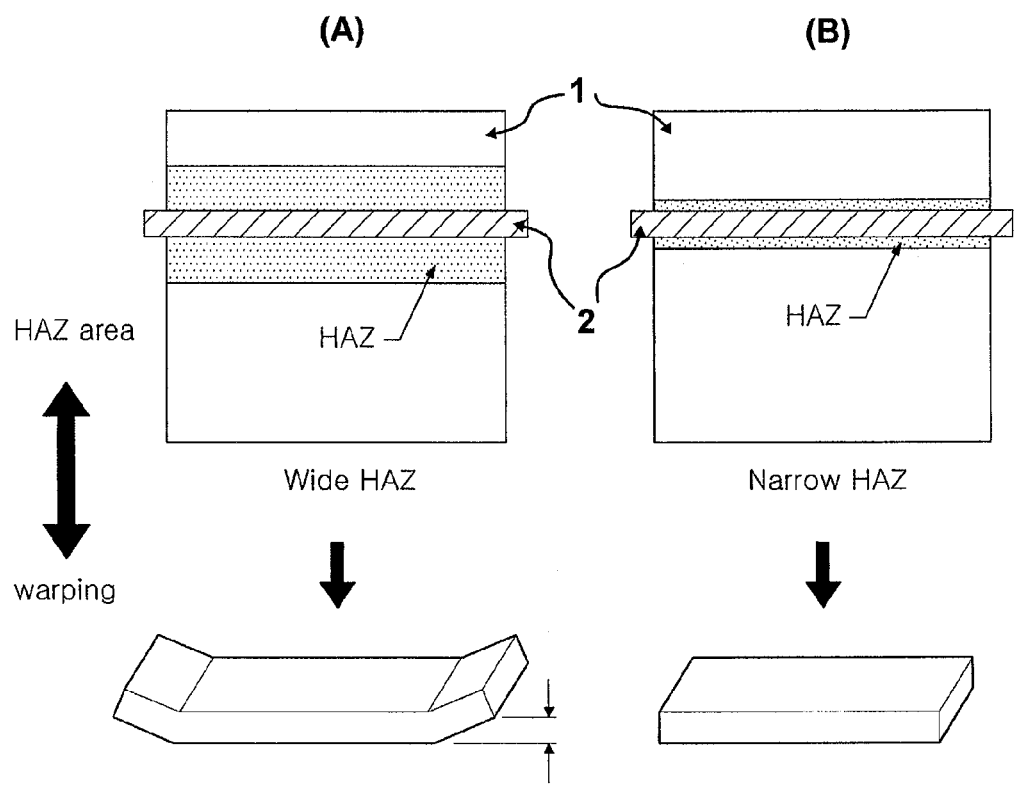
FIG. 4 is a schematic view illustrating deformation states of solar cells and a difference in HAZ during both a conventional tabbing process using an infrared lamp and the tabbing process according to the present invention.

According to the present method as described above, the contact portion can be locally heated during the tabbing process, so that the direct radiation zone to the contact portion can be minimized. Therefore, according to the present invention, the defect caused by different thermal expansion/contraction coefficients in the multi-layered solar cell can be prevented, and the process can be quickly and efficiently performed. FIG. 4 of the accompanying drawings is a view illustrating difference in direct radiation zone (HAZ; Heat Affecting Zone) (the area indicated with dots in FIG. 4) shown on the solar cells and deformation states of the solar cells in both a conventional tabbing process (FIG. 4 (*a*)) using an infrared lamp and a tabbing process (FIG. 4 (*b*)) according to one embodiment of the present invention. As shown in FIG. 4, the present invention makes it possible to remarkably reduce the direct radiation zone as compared with the conventional method, so that the defect caused by the non-uniform expansion/contraction of the multi-layered solar cell can be effectively prevented during the process or during cooling.

The present invention is related to an apparatus for manufacturing a solar cell module, which comprises: a worktable on which a solar cell is loaded; a compressing device capable of compressing a metal electrode on the solar cell loaded on the worktable; and a laser irradiation device capable of irradiating a contact portion of the solar cell and the metal electrode compressed by the compressing device with a laser.

FIG. 5 to FIG. 15 show various embodiments of the apparatus for manufacturing a solar cell module of the present invention.

The worktable 7 on which a solar cell 1 is loaded may be mounted on movable mean 8 (e.g., linear stepping motor) capable of precisely reciprocating the worktable in a predetermined speed in one or both directions, and therefore, the solar cell 1 mounted thereon can be moved in the predetermined speed, whereby the tabbing process can be performed while the contact portion is precisely scanned. Further, the worktable 7 may include at its upper portion a heating means such as a heating plate (e.g., vacuum heating plate) capable of heating the solar cell mounted thereon. Accordingly, after the solar cell 1 is mounted on the heating mean, the tabbing process can be performed while the solar cell is heated, so that a thermal loss phenomenon due to the high thermal conductivity of the crystal silicone solar cell can be prevented.

In the present invention, the kind of the compressing device is not specially limited, as long as it is configured to apply appropriate pressure to the metal electrode so that it is homogeneously and closely compressed onto the solar cell.

Figure 5:
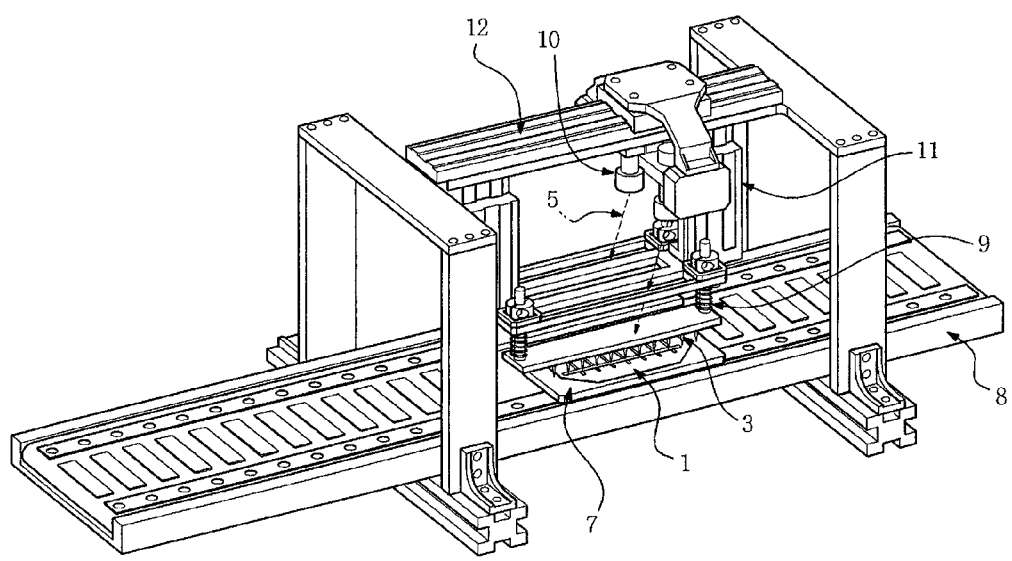
FIG. 5 to 15 are drawings indicating various embodiments of the apparatus for manufacturing a solar cell module.
Figure 6:
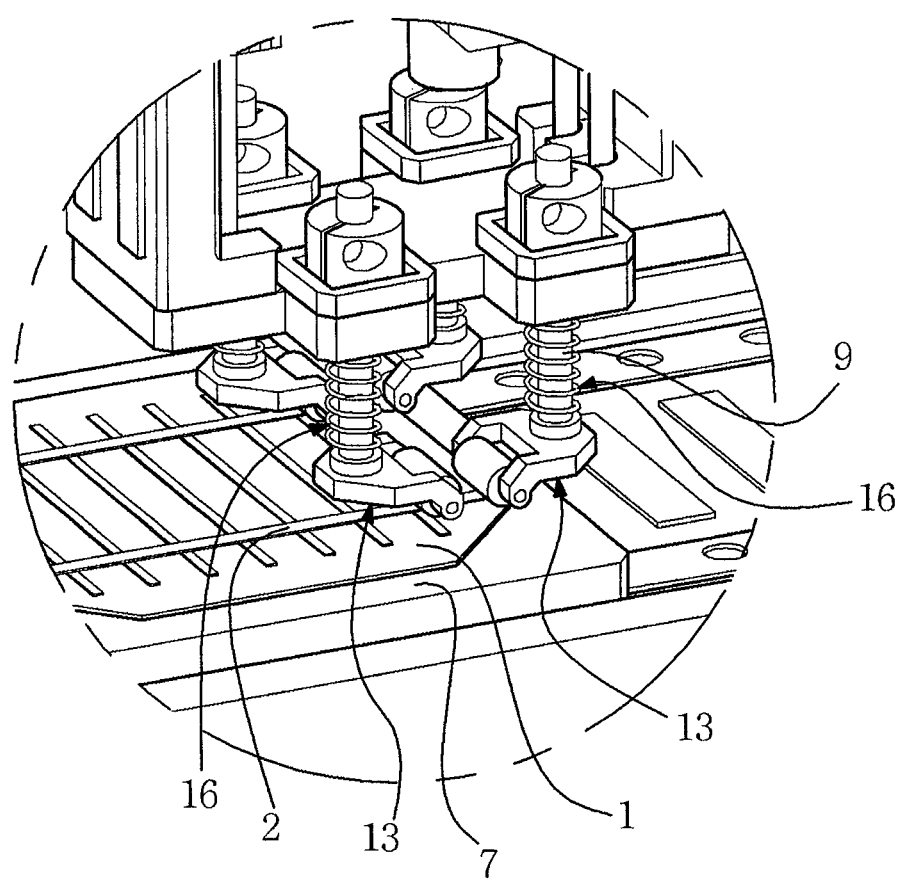
Figure 7:
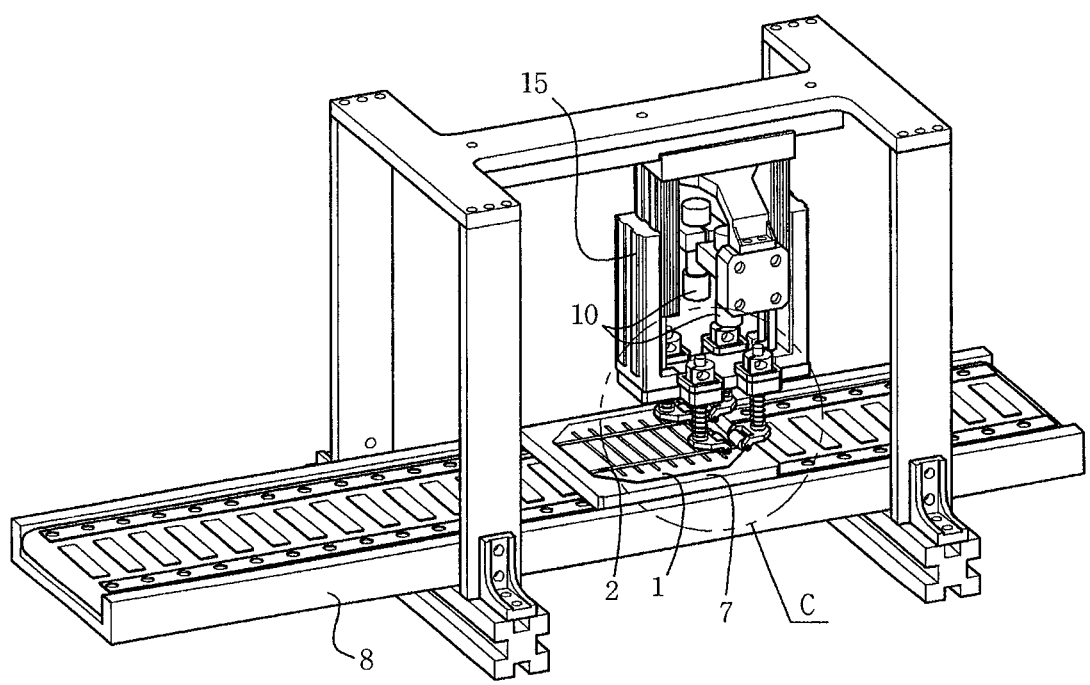
Figure 8:
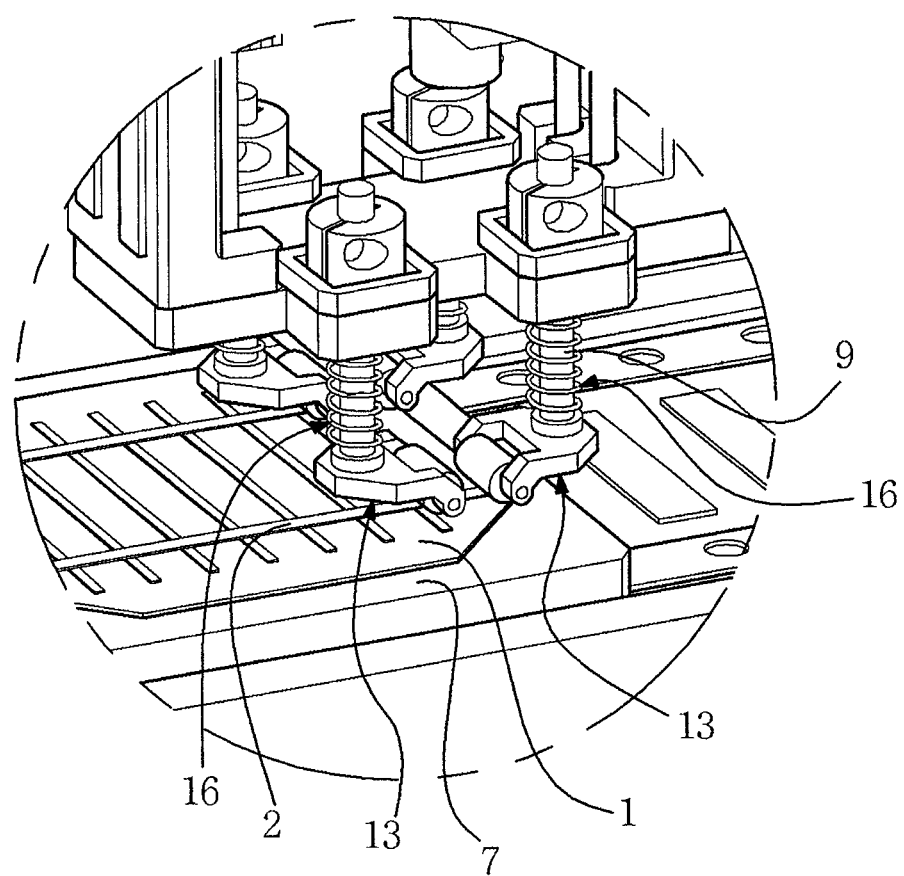
Figure 9:
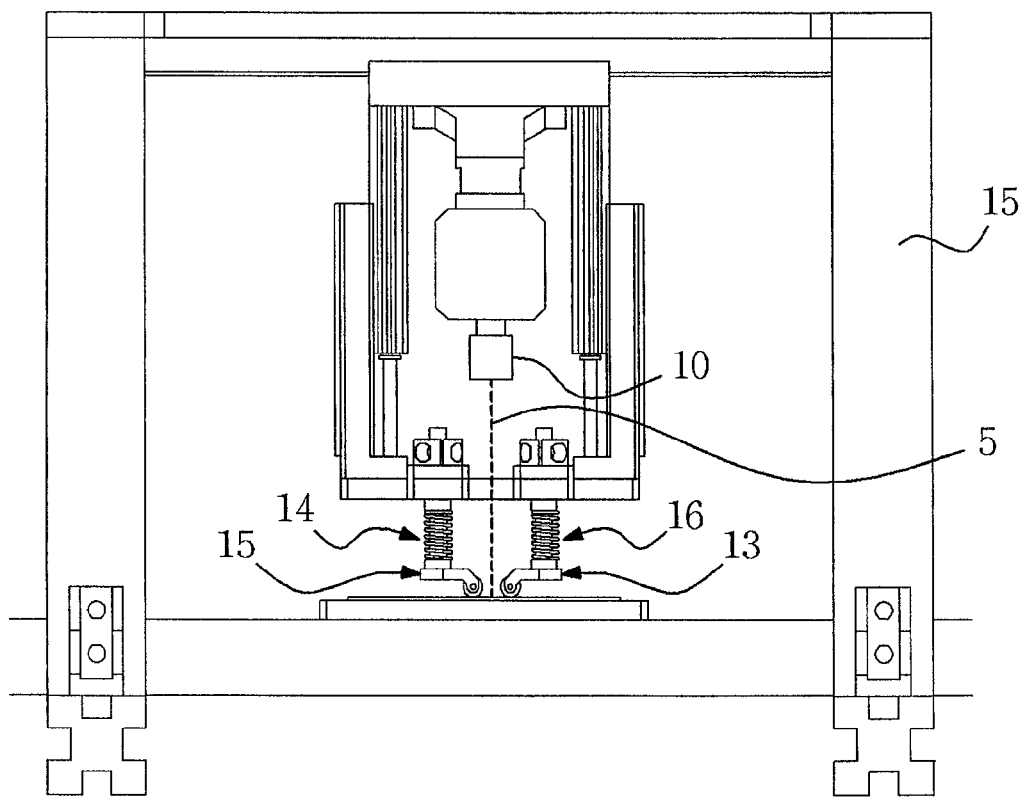
Figure 10:
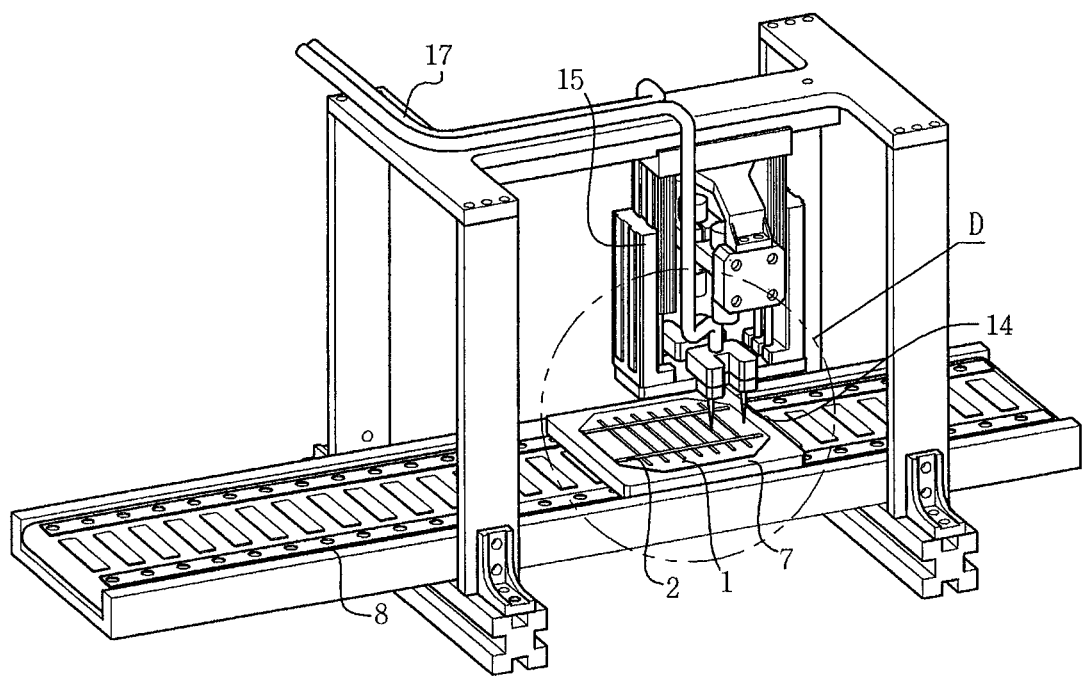
Figure 11:
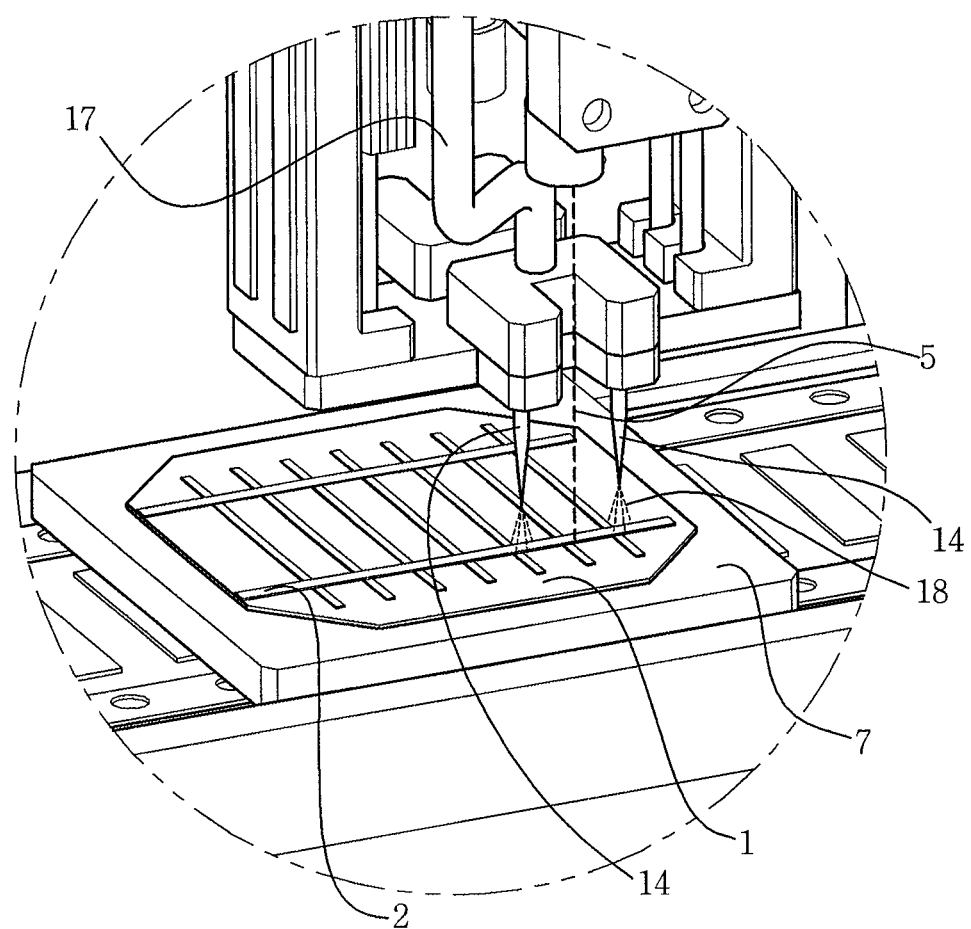
Figure 12:
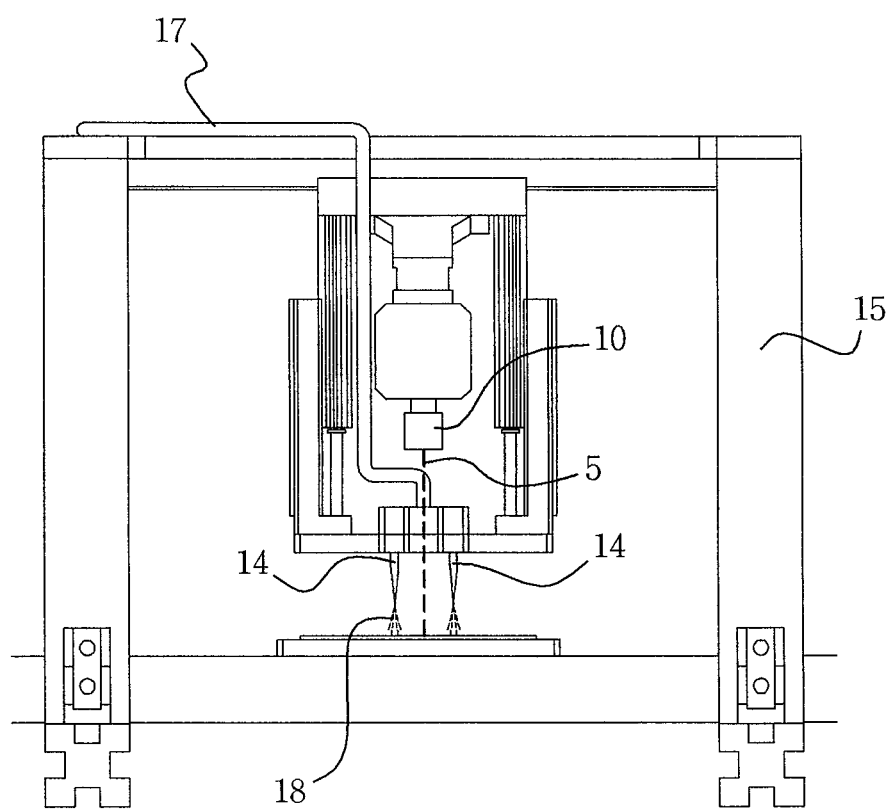

In one embodiment of the present invention, as shown in FIG. 5 or FIG. 6, the compressing device may comprise a shaft 9 capable of moving up and down; and a probe pin 3 or a pressurizing plate 4 connected with the terminal portion of the shaft 9. In one embodiment, the compressing device may be connected to a cylinder capable of being moved upward and downward, and the shaft 9 may have a buffer spring for effective compression process.

In one embodiment of the present invention, from the view point of homogenous and uniform compression, the compressing device may comprise a plurality of probe pins 3 arranged at regular intervals as indicated in FIG. 3, and the intervals between probe pins may be 2 mm to 10 mm, preferably 4 mm to 6 mm. However, the above description is no more than an example of the present invention, and therefore, the interval between probe pins can freely controlled in order to accomplish uniform and close contact between the metal electrode and the solar cell.

When the compressing device comprises a plurality of probe pins, a laser may be irradiated from lateral upper side with respect to a contact portion of the metal electrode and the solar cell, and the irradiation angle may be controlled with a range from 0 to 90 degrees, and preferably about 45 degrees. However, the above description is no more than one example of the present invention. For instance, the probe pin is made of laser-permeable ceramic as described later, the irradiation angle may be controlled so that a laser may be irradiated from the upper side perpendicular to the width-wise direction of the electrode in the contact portion of the electrode and the solar cell.

Also, the structure of the pressurizing plate 4 used herein is not specially limited, and it may have a bar shape and flat board shape.

In one embodiment, the probe pin or the pressurizing plate may be made of a laser permeable ceramic. The term 「laser permeable ceramic」 used herein refers to a heat-resistant transparent material through which a laser may permeate, and examples of the laser permeable ceramic comprises glass, quartz or zirconia. Also, an example of the zirconia includes crystal zirconia having a melting point of about 2,000° C. to 3,000° C., and more preferably zirconia having monoclinic crystal structure, tetragonal crystal structure or cubic crystal structure. Among these, the zirconia having a cubic crystal structure is preferable, since it has an excellent heat-resistance, but it is not limited thereto.

In the present invention, when a laser-permeable ceramic is used, there are several advantages as described below.

In case when a compressing device made of metal material, if a laser is directly radiated on the compressing device, the metal material is damaged, and thereby uniform compression can not be accomplished. Therefore, the irradiation angle of the laser is limited considering the possibility of the damage of the metal material. This defect becomes more serious when probe pin made of metal material is used, since difference in pressure is generated more easily. Also, when a compressing device is madder of metal material, it is not possible to radiate a laser from the upper side perpendicular to the width-wise direction of the electrode in the contact portion of the electrode and the solar cell, and it should be radiated from lateral side. In that case, the control of the irradiation angle is limited due to constitution of the apparatus. While, if the laser permeable ceramic is used, the compressing device may be prevented from being damaged, and laser may be radiated directly to the compressing device. Therefore, the irradiation direction and angle can be freely controlled, and it is possible that a laser is irradiated in the same vertical plane with the contact portion.

Therefore, by irradiating a laser with its defocused core size being controlled to be identical with the width of the metal electrodes after forming a uniform contact portion using a probe pin 3 or a pressurizing plate 4 made of the laser permeable ceramic, uniform and close tabbing from the start point to end point of the contact portion is possible. Also, the thermal damage of the solar cell is prevented, since a laser-irradiating range can be easily limited to the contact portion. Although it is not specially limited, it is preferable that the probe pin is made of zirconia, and the pressurizing plate is made of glass or quartz.

In one embodiment, the probe pin 3 or the pressurizing plate 4 may comprise thereon a coating layer containing fluorine compound. By comprising the coating layer, a lowering of the tabbing efficiency due to contamination after a long period of using may be prevented. In the present invention, the kinds of the fluorine compound is not specially limited, it may comprise $F_2$ or $CF_4$. At this time, surface treating methods or a thickness of the coating layer is not specially limited, and they are appropriately controlled considering the tabbing efficiency. Also, in the present invention, various surface treatment methods other than the method using the fluorine compound may be applied in order to prevent the contamination problems. Also, in the present invention, the compressing device (probe pin or pressurizing plate) may be configured so as to be separated from a frame and replaced. Therefore, the compressing device can be replaced by periods.

In one embodiment, as indicated in FIG. 7 to FIG. 12, the compressing device may comprise a compressing roll 13, or an air-nozzle 14 capable of spraying compressed air to the contact portion of the metal electrode and the solar cell. Also, the compressing roll 13 or air-nozzle 14 may be connected to a shaft 9 capable of moving up and down, or the compressing roll 13 or the air-nozzle 14 may be fixed at a predetermined height.

The air-nozzle 14 may comprise a micro-air-hole having a diameter of about 0.5 mm to about 2 mm, and may be installed about 1 mm to about 2 mm away from the metal electrode. Specially, if the air nozzle is configured so as to spray a heated compressed air (hot air), there is advantage in that it can compensate a heat loss due to a high heat conductivity of the silicone solar cell, and thereby more efficient tabbing process is possible. At this time, the temperature of the hot air may be 150° C. to 250° C., but it can be freely controlled considering the efficiency of the process.

In one embodiment, from the view point of more efficient compression and tabbing process, the compressing device may comprise a plurality of compressing rolls or air-nozzles. In this case, the compressing device may comprise a pair of compressing rolls 13 or a pair of air-nozzles 14 that are symmetrically installed with respect to a portion onto which a laser is radiated; and a laser irradiation device 10 (e.g., laser head) capable of irradiating a laser onto a electrode portion between the compressing rolls 13 or air-nozzles 14 from the upper side perpendicular to the width-wise direction of the metal electrode. In this case, as indicated in FIGS. 8, 9, 11 and 12, the compressing roll 13 or air-nozzles 14 may be installed in a support frame 15 built in H shaped frame so as to be symmetrical to each other according to tabbing direction (lengthwise direction of the metal electrode), and laser irradiation device 10 may be installed so as to irradiate a metal electrode between the compressing rolls 13 or the air-nozzles 14 with a laser 5. Therefore, contamination of the electrode parts and damage of the compressing device due to a laser may be prevented.

The compressing means (compressing rolls or air nozzles) and the laser irradiation device that are installed integrally may be comprised in the apparatus of the present invention so as to be movable according to the tabbing direction. However, if the worktable on which a solar cell is mounted is installed so as to be moved, the compressing device and the laser irradiation device may be fixed in the apparatus.

Also, in case when a pair of compressing rolls or air-nozzles is installed so as to be symmetrical to each other, the interval of the rolls or nozzles may be 2 mm to 10 mm, preferably 3 mm to 10 mm, and more preferably 4 mm to 6 mm, but it is not limited thereto.

Figure 13:
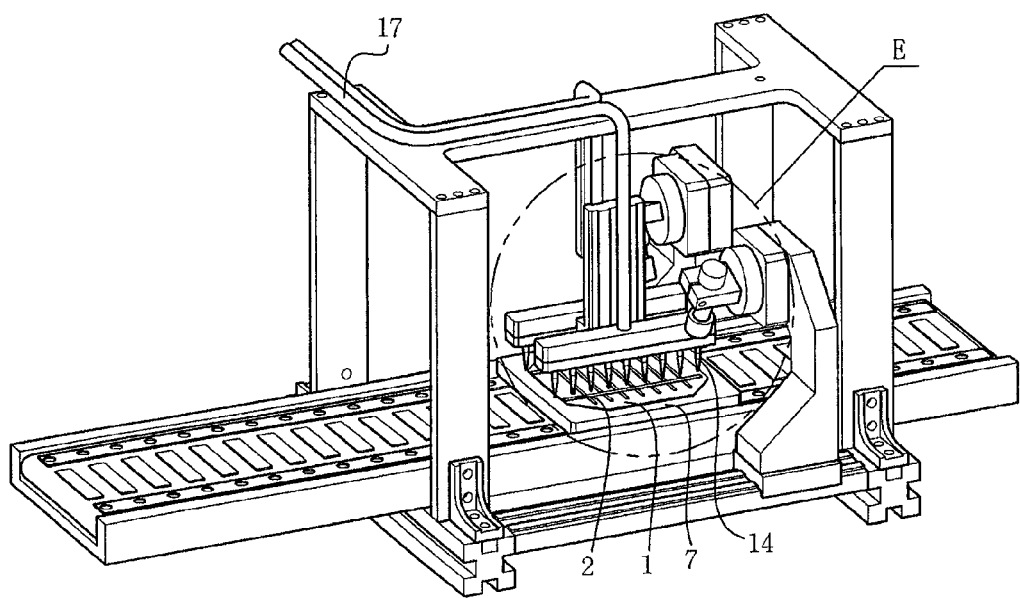
Figure 14:
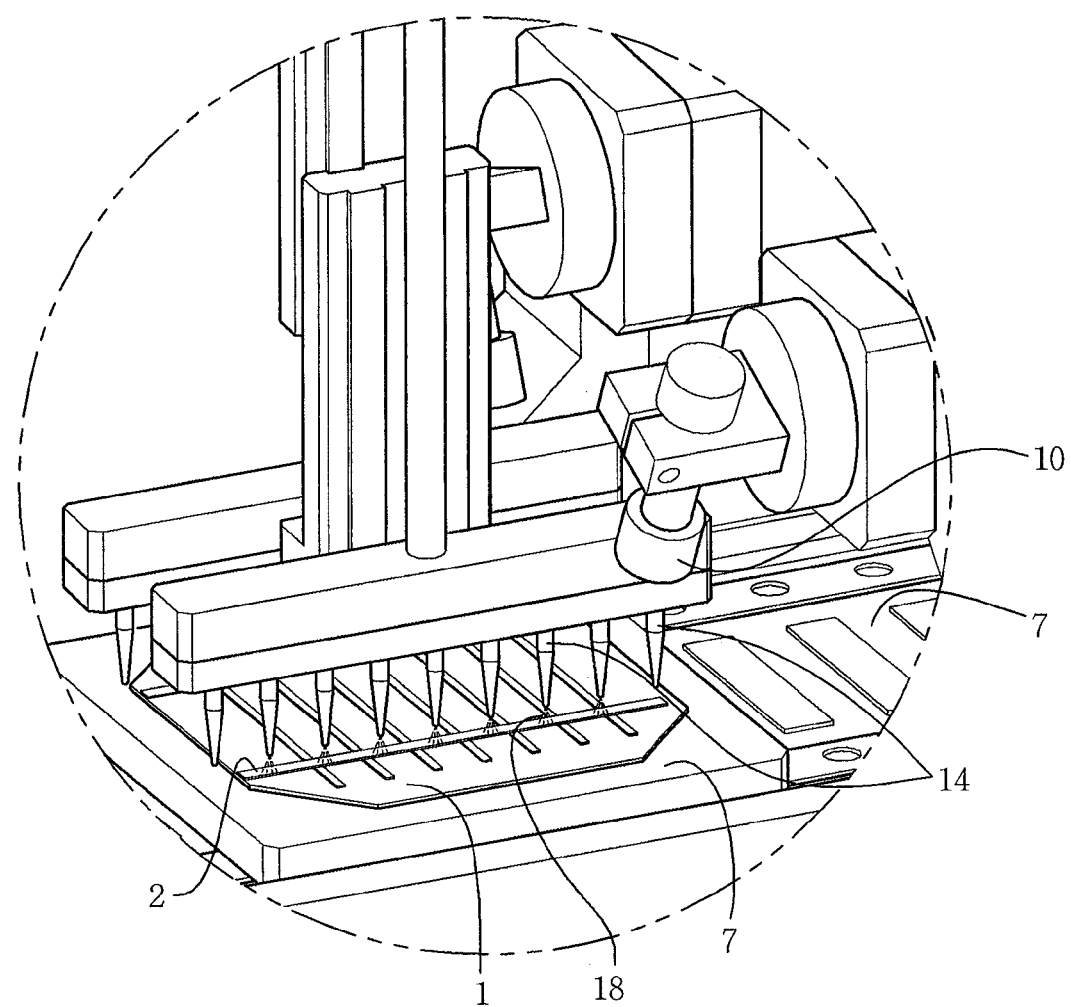
Figure 15:
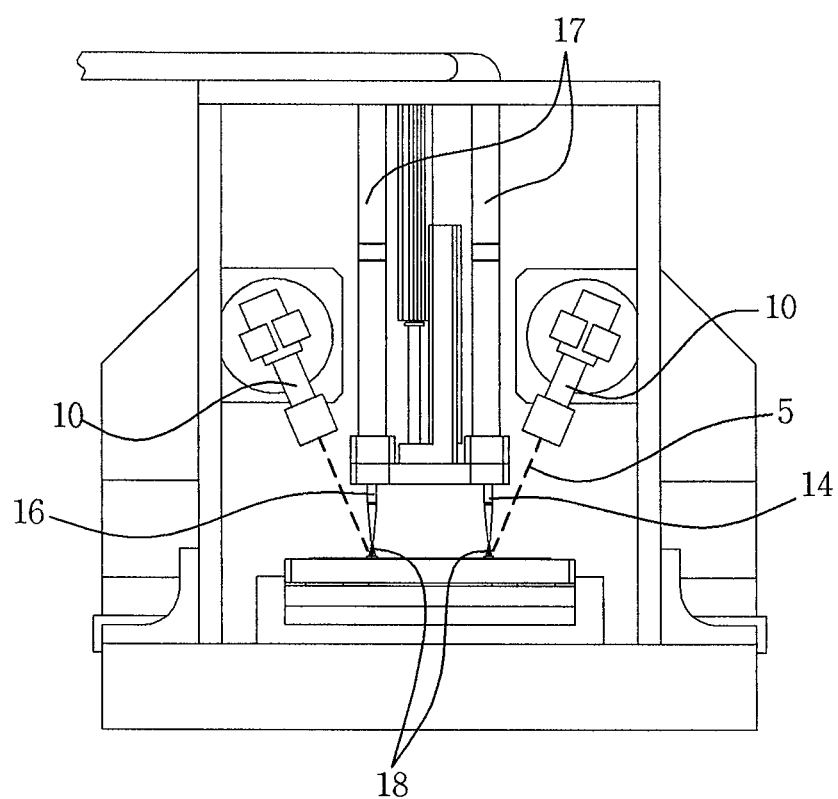

In another embodiment, as indicated in FIGS. 13 to 15, the compressing device may comprise a plurality of air nozzles 14 so as to pressurize the whole contact portion of the solar cell and the metal electrode simultaneously. In this case, the details concerning the air nozzle is same as described above.

Further, the kind of the laser irradiation device included in the tabbing apparatus of the present invention is not specifically limited. For example, the laser irradiation devices such as a fiber diode laser, a ruby laser ($Cr^{3+}$:$Al_2O_3$), YAG laser ($Nd^{3+}$:$Y_3Al_5O_{12}$), phosphate glass laser, silicate glass laser or YLF ($Nd^{3+}$:$LiYF_4$) may be used. In the present invention, from the viewpoint of having an excellent durability enough to be semi-permanently used and a low price, the fiber diode laser may be preferably used. In this case, the laser irradiation device may be configured to include a focusing head 11, an optical fiber and a laser source. Such laser irradiation device may be installed in the tabbing apparatus with clamping jig by H shaped frame as indicated in FIG. 5, and it may be installed in the upper side perpendicular to the widthwise direction of the contact portion of the metal electrode and the solar cell. However, it is only one example of the present invention, the structure of the apparatus is not specially limited, as long as it is installed so that a laser is irradiated from the upper side perpendicular to the width wise direction of the metal electrode.

Further, two laser irradiation devices may be respectively equipped on the left and right sides of the worktable in the apparatus of the present invention, and they may be configured to be movable in one or both directions. Further, if necessary, two or more laser irradiation devices may be used, so that the apparatus is configured to simultaneously irradiate the total length of the metal electrodes with a laser.

What is claimed is:

1. A method for manufacturing a solar cell module, comprising:
   a first step of compressing a metal electrode onto a solar cell; and
   a second step of performing a bonding process by irradiating a contact portion of the metal electrode and the solar cell with a laser,
   wherein the metal electrode is compressed with a pressure of 0.3 N/m to 0.6 N/m in the first step.

2. The method as claimed in claim 1, wherein the solar cell onto which the metal electrode is compressed in the first step is a crystal silicon solar cell.

3. The method as claimed in claim 1, wherein the solar cell onto which the metal electrode is compressed in the first step has a thickness of 80 μm to 200 μm.

4. The method as claimed in claim 1, wherein the metal electrodes are compressed on the front and rear surfaces of the solar cell in the first step.

5. The method as claimed in claim 1, wherein the second step is carried out while a lower portion of the solar cell is heated.

6. The method as claimed in claim 1, wherein the irradiation laser has a wavelength of 700 nm to 1000 nm.

7. The method as claimed in claim 1, wherein the laser is irradiated from the upper side perpendicular to the widthwise direction of the metal electrode in the contact portion.

8. The method as claimed in claim 1, wherein the irradiation angle of the laser is controlled to be less than 40° with respect to a vertical axis.

9. The method as claimed in claim 1, wherein the second step is carried out while a lower portion of the solar cell is heated at a temperature of 110° C. to 140° C.

10. The method as claimed in claim 1, wherein the laser radiated in the second step is a defocused laser.

11. The method as claimed in claim 10, wherein a defocused laser beam, in which the defocused laser is diffused at the contact portion, is controlled to be identical with the width of the metal electrode.

12. The method as claimed in claim 11, wherein the defocused laser beam size ranges from 1.5 mm to 2.5 mm.

* * * * *